(12) United States Patent
Drizlikh et al.

(10) Patent No.: US 7,247,544 B1
(45) Date of Patent: Jul. 24, 2007

(54) HIGH Q INDUCTOR INTEGRATION

(75) Inventors: Sergei Drizlikh, Scarborough, ME (US); Todd Patrick Thibeault, Limington, ME (US); Thomas Francis, South Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/121,242

(22) Filed: Apr. 12, 2002

(51) Int. Cl.
*H01L 21/76* (2006.01)
(52) U.S. Cl. .................................. 438/420
(58) Field of Classification Search ........... 257/355, 257/724, 531, 774; 438/420, 629, 637
See application file for complete search history.

(56) References Cited

U.S. PATENT DOCUMENTS

| | | | | |
|---|---|---|---|---|
| 5,296,392 A | * | 3/1994 | Grula et al. | 438/222 |
| 5,880,018 A | * | 3/1999 | Boeck et al. | 438/619 |
| 5,935,762 A | * | 8/1999 | Dai et al. | 430/312 |
| 6,383,916 B1 | * | 5/2002 | Lin | 438/637 |
| 6,472,721 B2 | * | 10/2002 | Ma et al. | 257/531 |
| 6,495,903 B2 | * | 12/2002 | Xu et al. | 257/531 |
| 6,504,227 B1 | * | 1/2003 | Matsuo et al. | 257/531 |
| 6,555,913 B1 | * | 4/2003 | Sasaki et al. | 257/773 |
| 2001/0028098 A1 | * | 10/2001 | Liou | 257/531 |
| 2002/0093075 A1 | * | 7/2002 | Gates et al. | 257/531 |
| 2002/0125575 A1 | * | 9/2002 | Chaen | 257/758 |
| 2002/0130386 A1 | * | 9/2002 | Acosta et al. | 257/531 |
| 2003/0003647 A1 | * | 1/2003 | Dennison et al. | 438/238 |
| 2003/0013264 A1 | * | 1/2003 | Yeo et al. | 438/381 |
| 2003/0076209 A1 | * | 4/2003 | Tsai et al. | 336/200 |
| 2003/0116850 A1 | * | 6/2003 | Volant et al. | 257/758 |
| 2005/0186768 A1 | * | 8/2005 | Sugaya et al. | 438/597 |

* cited by examiner

*Primary Examiner*—Nathan W. Ha
(74) *Attorney, Agent, or Firm*—Jurgen Vollrath

(57) ABSTRACT

In an inductor integration process, a high Q inductor is achieved by forming an AlCu inductor via prior to depositing the inductor dielectric.

12 Claims, 3 Drawing Sheets

HIGH Q INDUCTOR INTEGRATION

FIELD OF THE INVENTION

The invention relates to the formation of inductors in integrated circuits. In particular it relates to a high Q inductor and a method of forming such an inductor in an integrated circuit.

BACKGROUND OF THE INVENTION

Inductors are commonly used passive devices that find use in a wide assortment of circuits. With the development of integrated circuits (ICs), methods have been developed to integrate inductors into ICs. One such approach involves a tungsten plug process in which an inductor via is formed in an inductor dielectric and then filled with tungsten. However, due to the considerable thickness of the inductor dielectric, the inductor via displays a high resistance, which limits its performance, especially in high power applications. In an attempt to limit the resistance, some processes have sought to limit the thickness of the inductor dielectric. While this reduces the inductor via resistance, the thinner dielectric, however, also retards the performance of the inductor.

The present invention seeks to address some of the problems encountered with current integrated inductors.

SUMMARY OF THE INVENTION

According to the present invention, the inductor via is formed prior to depositing the inductor dielectric. Further, according to the invention, the inductor via is preferably made of AlCu.

The invention provides a method for forming an inductor in an integrated circuit, comprising forming an inductor via, and thereafter depositing an inductor dielectric and forming an inductor. The via may be formed by depositing a first dielectric on top of a first metal layer, forming a hole in the first dielectric, depositing a second metal layer over the first dielectric to contact the first metal layer through the hole, and etching back the second metal layer to define inductor via studs. The method typically includes clearing the inductor dielectric from the inductor via and forming the inductor to contact the top of the inductor via. The clearing of the inductor dielectric from the inductor via may include planarizing the inductor dielectric and then etching back the inductor dielectric, for example, by means of a dry oxide etch step. The inductor dielectric will typically form a peak over the inductor via stud with troughs on either side. The inductor dielectric may, instead, be cleared from the inductor by depositing a resist in the troughs and etching back the inductor dielectric over the inductor via using a resist etch back step. The second metal layer preferably comprises AlCu. Forming the first dielectric may include depositing a dielectric layer, for example to a thickness of 18 kÅ and polishing the dielectric layer down. Preferably the ratio of the depth of the hole, as defined by the thickness of the first dielectric after polishing, to the width of the hole is at least 1:3 and preferably 1:10 or more. The etching back of the second metal layer to define the inductor via studs may include depositing a resist on the second metal layer and selectively etching away parts of the second metal layer using a reverse inductor via mask.

Further, according to the invention, there is provided an integrated inductor in an integrated circuit, comprising an inductor metal connected to a metal layer of the integrated circuit by means of an AlCu via stud.

DETAILED DESCRIPTION OF THE INVENTION

Figure 1:
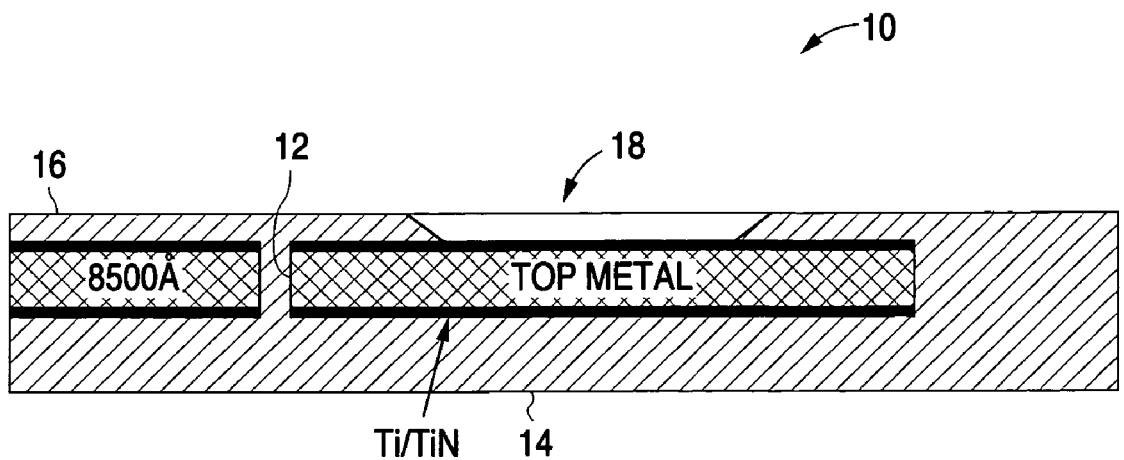
FIG. 1 is a sectional representation of part of an integrated circuit device after completion of some of the process steps involved in forming an inductor according to the invention.

FIG. 1 shows part of an integrated circuit device 10 after completion of several process steps in the formation of an inductor in accordance with the invention. The device 10 includes a 8500 Å thick top metal layer 12 of AlCu capped with Ti or TiN formed on an interlevel dielectric (D5) 14. A dielectric 16 is deposited on top of the capped metal layer 12 using a high-density plasma (HDP) deposition or Sequel process. Initially the dielectric 16 is deposited to a thickness of about 18 kÅ and is then polished down to a thickness of 3 kÅ as depicted in FIG. 1. The dielectric 16 remaining over the top metal 12 acts as an etch stop for subsequent processing. Using an inductor via mask (not shown) a hole 18 is etched in the dielectric 16 for the inductor via. In this embodiment, the width of the hole is approximately 4 μm. Thus the ratio of hole depth to width is 3000:40 000 or just over 1:13. It has been found that a ratio of more than 1:3 avoids excessive dimpling of the inductor metal that is later formed as will be discussed in greater detail below.

Figure 2:
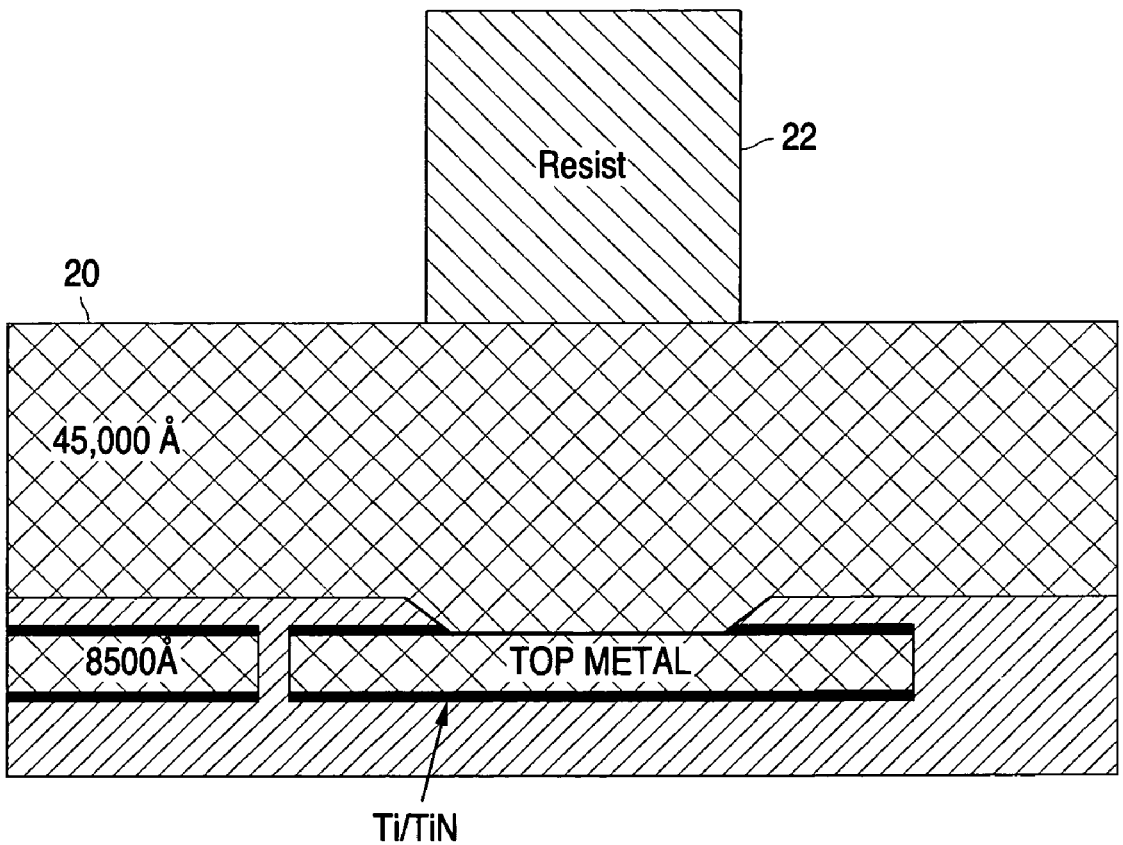
FIG. 2 is a sectional representation of part of an integrated circuit device after completion of additional process steps involved in forming an inductor according to the invention.

Once the dielectric 16 has been polished down to the desired thickness and the holes 18 have been etched, the surface is cleaned using a sputter etch step in the process. Thereafter metal 20 is deposited to a thickness of 45000 Å as shown in FIG. 2. The metal 20 will ultimately form the inductor via, and it has been found that a high conductivity metal such as AlCu works particularly well. By adopting the approach of the invention of forming the via prior to depositing the inductor dielectric, AlCu can be used for the via posts. This reduces the resistance of the vias and allows thick inductor dielectrics to be used, which improves the inductor performance. Using AlCu for the inductor vias provides for a higher Q inductor and higher current density due to low resistance (2.7 micro ohms-centimeter), compared to tungsten vias (5.7 micro ohms-centimeter) of same cross section area. The inductor metal layer can thus be used for power routing. Other low resistance alternatives for AlCu can be used, for example, Cu damascene. One drawback of Cu damascene, however, is that it is relatively new process technology and cannot be easily or cheaply implemented into existing factories that use AlCu metalization.

In the steps discussed above, the via studs are formed prior to depositing the inductor dielectric since this approach allows the AlCu vias to be implemented using a standard process flow that uses AlCu for metal. While it is possible to adopt a standard process flow in which dialectic is deposited prior to via formation using AlCu, this requires heating of the wafer to 500° C. or more to allow AlCu to flow into the via hole and fill it. Such a process has several disadvantages: it is very slow (deposition rates of few angstrom/seconds), it increases wafer thermal budget significantly, and it requires specially modified and upgraded deposition tools. In contrast, forming the AlCu studs prior to the dielectric deposition allows normal sputter deposition rates (170 A/second) to be achieved and uses a standard AlCu sputter process that does not require any tool modifications.

Figure 3:
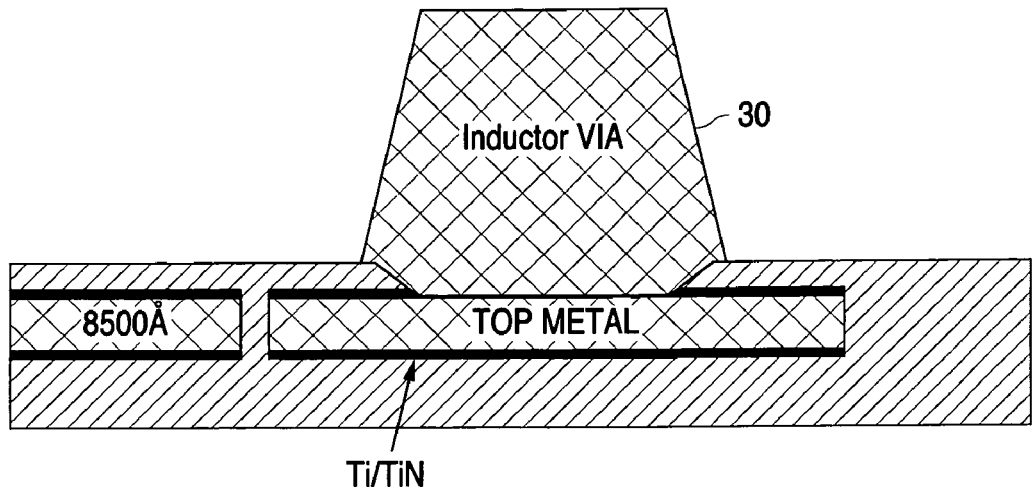
FIG. 3 is a sectional representation of part of an integrated circuit device after completion of yet additional process steps involved in forming an inductor according to the invention.

As mentioned above, by keeping the ratio of the hole 18 (FIG. 1) above approximately 1:3, the metal 20 can more easily fill the hole 18 and avoids excessive dimpling at the upper surface of the metal 20. It will be appreciated that smaller ratios could be adopted but would result in greater dimpling of the upper surface of the metal 20. Resist 22 is deposited on the metal 20 and initially forms a layer over the metal 20. Using a reverse via mask, some of the resist is removed leaving only the portion above the hole 18 (FIG. 1), as shown in FIG. 2. The metal 20 is then etched using a dry etch process whereafter the remaining resist 22 is removed to leave an inductor via 30 as shown in FIG. 3. As can be seen in FIG. 3, the sidewalls of the inductor via 30 have been etched to an angle of approximately 85° to the horizontal, which allows for better subsequent filling with dielectric.

Figure 4:
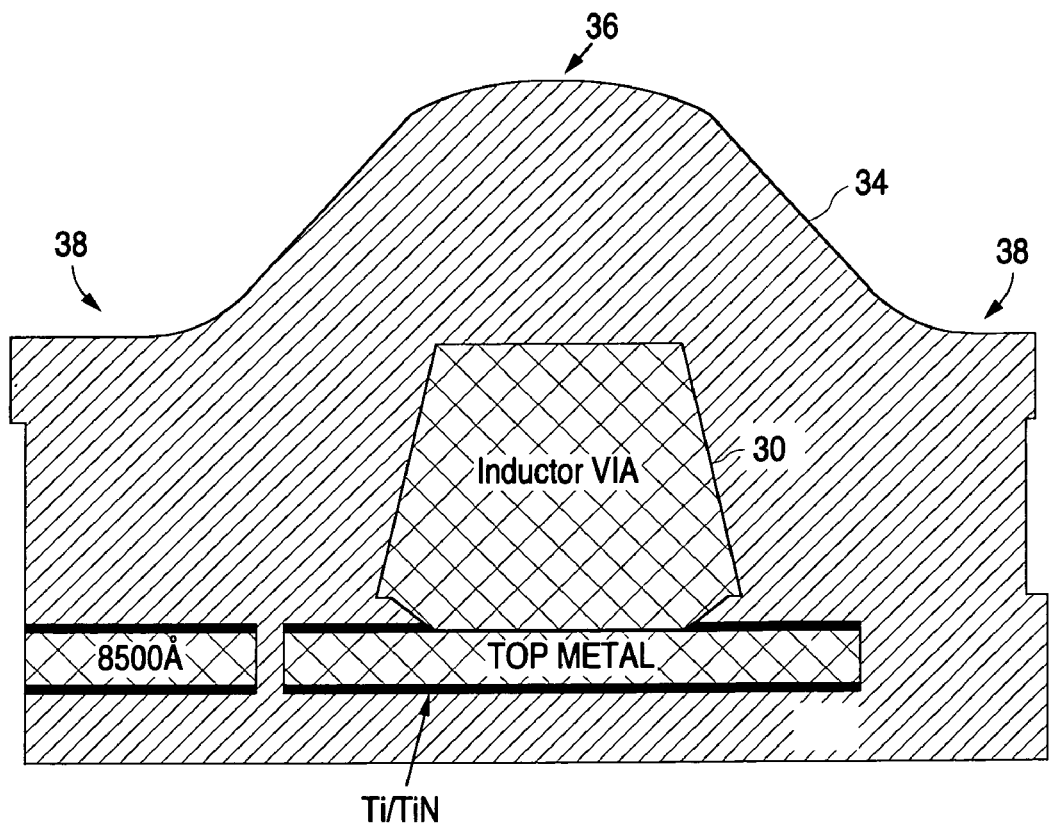
FIG. 4 is a sectional representation of part of an integrated circuit device after completion of yet additional process steps involved in forming an inductor according to the invention.

Referring to FIG. 4, inductor dielectric 34 is then deposited to a thickness of about 50 kÅ to form a peak 36 over the inductor via 30, with troughs 38 on either side. In order to clear the dielectric 34 over the inductor via 30 a variety of approaches can be used. In this embodiment, a planarization scheme in the form of chemical mechanical polishing (CMP) is used to planarize the dielectric 34. The CMP removes approximately 15 kÅ. This is followed by an oxide etch back that clears the remaining dielectric 34 over the inductor via 30 as shown in FIG. 5.

Instead of a CMP and oxide etch back approach, the inductor could, instead, be cleared from the inductor via by depositing a resist to fill the troughs 38, and then etching away the peak 36 using a resist etchback process.

Figure 5:
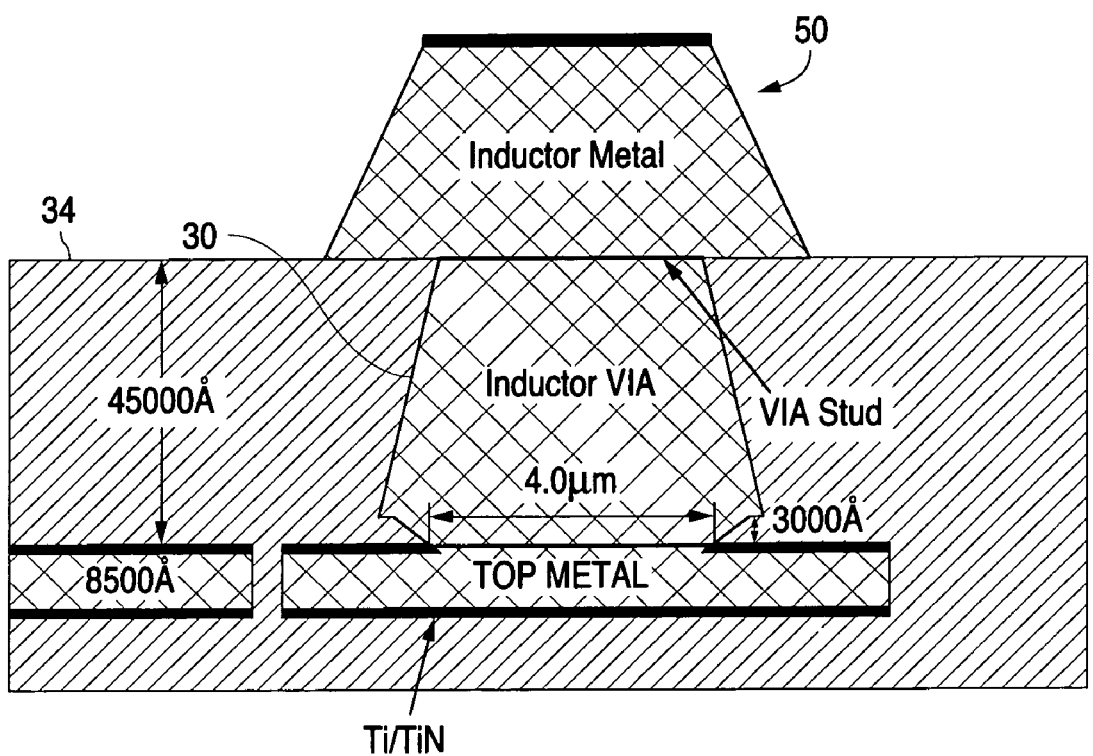
FIG. 5 is a sectional representation of part of an integrated circuit device after completion of yet additional process steps involved in forming an inductor according to the invention.

Once the inductor dielectric has been cleared over the inductor via 30, an inductor metal layer is deposited which is masked and etched back in a metal etch process to form the inductor metal structure 50 shown in FIG. 5.

While the present invention has been described with respect to specific process steps and materials, it will be appreciated that the benefits of the invention can be realized using different materials, such as copper damascene, without departing from the scope of the claims, or by using different process steps in conjunction with the use of AlCu.

What is claimed is:

1. A method of forming a via between metal layers in an integrated circuit, comprising
    forming a via post by depositing a metal layer, performing a photoresist and masking step, and etching away the metal to leave the via post, and
    thereafter depositing a main dielectric through which the via post extends.

2. A method of claim 1, wherein the step of depositing a metal layer is preceded by forming a first metal layer, forming a first dielectric layer on top of the first metal layer, and forming a hole in the first dielectric, and thereafter depositing said metal layer to define a second metal layer over the first dielectric to contact the first metal layer through the hole, etching back the second metal layer to define the via post, and depositing the main dielectric layer over the via post so that the via post extends through the main dielectric layer.

3. A method of claim 2, further comprising clearing the main dielectric from the via post and forming an inductor to contact the top of the via post.

4. A method of claim 3, wherein the clearing of the main dielectric from the via post includes planarizing the main dielectric and then etching back the main dielectric.

5. A method of claim 4, wherein the etching back of the main dielectric is done using a dry oxide etch step.

6. A method of claim 2, wherein the main dielectric forms a peak over the via post with troughs on either side, and the main dielectric is cleared from the via post by depositing a resist in the troughs and etching back the dielectric over the via post by means of a resist etch back.

7. A method of claim 2, wherein the second metal layer comprises AlCu.

8. A method of claim 2, wherein forming the first dielectric includes depositing a dielectric layer, and polishing the dielectric layer down to a predetermined thickness.

9. A method of claim 8, wherein the first dielectric layer is deposited to a thickness of approximately 18 kÅ.

10. A method of claim 8, wherein the ratio of the depth of the hole as defined by the thickness of the first dielectric after polishing, to the width of the hole, is at least 1:3.

11. A method of claim 10, wherein the ratio of the depth of the hole to the width of the hole is at least 1:10.

12. A method of claim 2, wherein the etching back of the second metal layer to define the via includes depositing a resist on the second metal layer and selectively etching away parts of the second metal layer using a reverse via mask.

* * * * *